United States Patent [19]

Yamashina et al.

[11] Patent Number: 4,652,324

[45] Date of Patent: Mar. 24, 1987

[54] PROCESS FOR THE PRODUCTION OF LAMINATED SHEET

[75] Inventors: Naotoshi Yamashina; Fumihiko Yabuta, both of Tokyo, Japan

[73] Assignee: Sanyo-Kokusaku Pulp Co., Ltd., Tokyo, Japan

[21] Appl. No.: 655,446

[22] Filed: Sep. 28, 1984

[30] Foreign Application Priority Data

Oct. 7, 1983 [JP] Japan ................................ 58-187975

[51] Int. Cl.$^4$ ........................ B32B 23/06; B32B 31/04
[52] U.S. Cl. .................................. 156/242; 156/62.2; 156/62.6; 156/62.8; 156/288; 162/13; 162/105; 162/106; 162/138; 162/DIG. 5
[58] Field of Search ...................... 156/242, 288, 62.2, 156/62.6, 62.8; 162/13, 105, 106, 132, 138, 164.1, 164.3, 165, 168.1, DIG. 5; 264/128

[56] References Cited

U.S. PATENT DOCUMENTS 2,698,234 12/1954 Seaman .......................... 162/DIG. 5
4,397,882 8/1983 Franz et al. ......................... 162/138

FOREIGN PATENT DOCUMENTS 696920 11/1964 Canada ............................... 156/62.8
1803677 6/1969 Fed. Rep. of Germany ..... 156/62.2
9048901 5/1974 Japan ............................ 162/DIG. 5
524879 9/1976 U.S.S.R. ....................... 162/DIG. 5

*Primary Examiner*—Caleb Weston
*Attorney, Agent, or Firm*—Oblon, Fisher, Spivak, McClelland & Maier

[57] ABSTRACT

A process for the production of a laminated sheet is disclosed, which comprises impregnating a base paper for laminated sheet using a wood pulp having an α-cellulose content of 87.0% or more with a synthetic resin to prepare a prepreg and subjecting the prepreg to laminate molding by heat. A process for the production of a metal foil-clad laminated sheet is also disclosed, which comprises impregnating a base paper for laminated sheet using a wood pulp having an α-cellulose content of 87.0% or more with a synthetic resin to prepare a prepreg, piling up the prepreg, placing a metal foil one either one or both sides of the prepregs, and subjecting the resulting prepregs with metal foil to laminate molding by heat. The laminated sheet or metal foil-clad laminated sheet of this invention has not only excellent punchability but also excellent electric characteristics and heat resistance and hence, it is quite useful as a laminated sheet for high density printed wiring system.

12 Claims, No Drawings

PROCESS FOR THE PRODUCTION OF LAMINATED SHEET

BACKGROUND OF THE INVENTION

1. Field of the Invention

This invention relates to a process for producing of laminated sheets which have excellent electrical characteristics such as insulation resistance, dielectric constant or dielectric dissipation factor and heat resistance and which are excellent, in particular, in punchability and more particularly, it relates to a process for the production of laminated sheets comprising a base paper using wood pulp having an α-cellulose content of 87.0% or more.

2. Description of the Prior Art

Laminated sheets are produced by impregnating a base paper suitable for laminated sheet with a synthetic resin and molding thereof and are widely used for industrial and home electronic equipments. In recent years, printed wiring boards have come to be used under more stringent conditions due to substantial developments in the electronic industry. Hence there has been a strong increase in requests for specific physical properties of laminated sheets. In particular, laminated sheets having good punchability in response to the increased demand for higher density printed wirings these days.

Base papers for laminated sheets which are widely used at present made from wood pulp as a raw material, are obtained from a bleached kraft pulp having an α-cellulose content of 83 to 86%. Formation of cracks around punched holes or delamination is found in laminated sheets using a base paper as a substrate and hence, laminated sheets requiring punchability cannot be obtained therefrom. When the punching processing is conducted at high temperatures the punching shearing force of the laminated sheet becomes small whereby the punchability can be improved. However, expansion and shrinkage accompanying the heating and cooling steps become high, thereby the resulting laminated sheet is no longer suitable for use in high density printed wiring where dimensional stability is required. Another case is that of cotton linter papers which are base papers for laminated sheets using non-wood pulp. These papers have relatively good punchability but have the added problem of a dimensional stability and are therefore are not suitable for use in laminated sheets for high density printed wiring. Further, the cotton linter papers suffer from yearly price fractuation and lack of market stability in regards to their supply. Thus the appearance of a base paper which is produced from wood pulps of stabilized supply and which can meet the above requirements is desired.

On the other hand, investigations on the punchability have also been made with respect to various plasticizations of synthetic resins. However, in view of problems in the electric characteristics and heat resistance thereof, thoroughly satisfactory results have not yet been obtained.

In order to overcome the above described drawbacks, the present inventors have extensively studied the subject matter and found that, if wood pulps having an α-cellulose content of 87.0% or more are used for producing base papers, laminated sheets having excellent punchability and excellent electric characteristics and heat resistance can be obtained as described by the present invention.

SUMMARY OF THE INVENTION

This invention provides a laminated sheet comprising a base paper for laminated sheet using a wood pulp having an α-cellulose content of 87.0% or more, which is prepared by impregnating the paper substrate with a synthetic resin to obtain a prepreg and subjecting the prepreg to laminate molding with the aid of heat.

DETAILED DESCRIPTION OF THE INVENTION

The raw material wood pulp which is used in this invention is required to have an α-cellulose content of 87.0% or more. If the α-cellulose content is below 87.0%, a laminated sheet having good punchability cannot be obtained, as described above.

The term "α-cellulose content" as referred to herein means a value denoting a percentage of a portion which retains without being dissolved after treating the pulp with a 17.5% sodium hydroxide solution under a prescribed condition, based on the absolute dry weight of the sample, and can be a criterion for evaluating a degree of purification of the pulp. The measurement is carried out in accordance with the method as defined in JIS P8101.

In the production of wood pulp having an α-cellulose content of 87.0% or more, for example, wood chips are chemically pulped by means of acid sulfite, bisulfite, or kraft cooking, or multi-stage cooking combining these manners, and after alkali purification or alkali extraction steps, the pulp is highly bleached with a bleaching agent such as chlorine, chlorine dioxide, hypochlorite, hydrogen peroxide, etc. In the case of the kraft cooking, hydrolysis with superheated steam is previously carried out prior to the cooking, and cold alkali purification may be carried out before or after bleaching process. The thus obtained pulp is generally called as "dissolving pulp", but the wood pulp of this invention having an α-cellulose content of 87.0% or more does not necessarily follow the process for the production of dissolving pulp. Accordingly, there are no specific restrictions with respect to the kind of wood chips, the method of cooking, the method of bleaching, and the method of purification.

The pulp which is used in this invention is not limited to a single wood pulp but two or more of wood pulps having a different α-cellulose content can be blended. Namely, it is only a requirement that a content of the α-cellulose in the whole of the pulp is 87.0% or more.

There are no specific restrictions with respect to the freeness of pulp in making a base paper for laminated sheet used in this invention, but in order to obtain a good permeability of the resin into the base paper for laminated sheet, it is required that the pulp is relatively lightly beaten to an extent of a CSF of 450 ml or more.

There are also no specific restrictions with respect to the basis weight and density of the base paper for laminated sheet, but taking into account the workability and productivity during the processing into a laminated sheet, it is suitable that the basis weight is about 80 to 200 g/m$^2$ and the density is about 0.4 to 0.6 g/cm$^3$.

If desired, the base paper for laminated sheet used in this invention may contain a filler, a pigment, a dye, a wet or dry strength agent, a flame retarding aid, and a flame retardant, etc. In this regard, there are no specific restrictions in their methods, and it is possible to incorporate them into a stuff with optional choice such as internal addition and/or size press.

While the reasons why the punchability of the laminated sheet using the thus obtained base paper for laminated sheet comprised of a wood pulp having an α-cellulose content of 87.0% or more is good are not completely clear, it can be considered that the punching shearing force is reduced due to the substantial disappearance of lignin present between the microfibrils and the reduction of polymerization degree of cellulose caused by more heavy cooking and bleaching.

The base paper for laminated sheet is then impregnated with a synthetic resin to prepare a prepreg which is subsequently subjected to laminate molding. Examples of the resin for laminated sheet which can be used include thermosetting resins selected from the group consisting of a phenolic resin, a melamine resin, a diallyl phthalate resin, an epoxy resin, and an unsaturated polyester resin, etc. and thermoplastic resins selected from the group consisting of a fluorocarbon resin, a polyester resin, and a polyamide resin, etc.

As described above, the base paper for laminated sheet is impregnated with such a resin to prepare a prepreg which is the subjected to laminate molding to obtain the desired laminated sheet. With respect to the impregnation and laminate molding by heat, any known methods can be employed. A resin content in the prepreg is preferable in the range of from 40 to 65%.

If desired, the synthetic resin used in this invention may be incorporated with a filler, a pigment, a dye, and a flame retardant, etc.

A metal foil-clad laminated sheet can be obtained by placing a metal foil on either one or both sides of the plies comprised of the plied prepregs and subjecting the resulting prepregs with metal foil to laminate molding by heat. With respect to the metal foil, there are no specific restrictions but a copper foil, an aluminum foil and the like can be employed. Further, if desired, an adhesive may be previously applied on the back side of the metal foil.

Because of the use of a base paper for laminated sheet comprising a wood pulp having an α-cellulose content of 87.0% or more, the thus prepared electrically insulating laminated sheet or metal foil-clad laminated sheet not only has excellent punchability as compared with the conventional laminated sheets using a base paper made of a kraft pulp having an α-cellulose content below 87.0% but also is found to have improved effects in various characteristics such as electric characteristics and heat resistance. Thus this invention gives rise to a quite great industrial meaning as the technique for the production of laminated sheet for high density printed wiring system.

This invention is explained in more detail with reference to the following examples. In the examples and comparative examples, the term "%" all means percent by weight

EXAMPLE 1

A bleached hardwood sulfite pulp having an α-cellulose content of 87.8% was beaten to an extent of a CSF of 500 ml and subjected to paper making by means of a test paper machine without being blended with additives. A paper thus obtained had a basis weight of 135 g/m$^2$ and a density of 0.5 g/cm$^3$. This base paper for laminated sheet was impregnated with a phenolic resin, the solids content of which had been adjusted to 50% with methanol, and dried to prepare a prepreg having a resin content of 50%. Eight prepregs thus prepared were piled and molded by heat and pressure at 160° C. for 50 minutes at 100 kg/cm$^2$ to obtain a laminated sheet having a thickness of 1.6 mm.

As shown in the table below, the thus obtained laminated sheet was especially excellent in the punchability at 55° C. or lower and was excellent in the insulation resistance after boiling and the dielectric constant and dielectric dissipation factor after moisture absorption treatment as well as the heat resistance.

EXAMPLE 2

A prepreg having a resin content of 50% was prepared from the same base paper for laminated sheet and phenolic resin as in Example 1. Eight prepregs thus prepared were piled, and an adhesive-applied copper foil having a thickness of 35 microns was placed on one side of the Prepregs. The resulting prepregs with copper foil was molded by heat and pressure same conditions as in Example 1 to obtain a copper foil-clad laminated sheet having a thickness of 1.6 mm.

As also shown in the table below, the thus obtained copper foil-clad laminated sheet had substantially the same excellent characteristics as in the laminated sheet (non copper foil-clad) of Example 1.

EXAMPLE 3

A laminated sheet having a thickness of 1.6 mm was obtained in the same manner as in Example 1 except that a bleached softwood sulfite pulp having an α-cellulose content of 90.1% and beaten to an extent of a CSF of 600 ml was used.

As shown in the table below, the thus obtained laminated sheet was excellent in the punchability and was excellent in the insulation resistance at normal state and after boiling and the dielectric constant and dielectric dissipation factor after moisture absorption treatment as well as the heat resistance.

EXAMPLE 4

A laminated sheet having a thickness of 1.6 mm was obtained in the same manner as in Example 1 except that a bleached hardwood kraft pulp having an α-cellulose content of 97.7% and beaten to an extent of a CSF of 500 ml was used.

As shown in the table below, the thus obtained laminated sheet was unrivaled in the punchability at 35° C. and was quite excellent in the insulation resistance at normal state and after boiling and the dielectric constant and dielectric dissipation factor after moisture absorption treatment as well as the heat resistance.

EXAMPLE 5

A laminated sheet having a thickness of 1.6 mm was obtained in the same manner as in Example 1 except that a 1:1 mixed pulp of a bleached hardwood kraft pulp having an α-cellulose content of 85.3% and a bleached hardwood kraft pulp having an α-cellulose content of 97.9%, both of which pulps had been beaten to an extent of a CSF of 500 ml, was used.

As shown in the table below, the thus obtained laminated sheet was excellent in the punchability and was excellent in the insulation resistance at normal state and after boiling and the dielectric constant and dielectric dissipation factor after moisture absorption treatment as well as the heat resistance.

EXAMPLE 6

A bleached hardwood kraft pulp having an α-cellulose content of 97.7% was beaten to an extent of a CSF of 500 ml and followed by paper making without additives by means of a test paper machine. There was thus prepared a base paper for laminated sheet having a basis weight of 135 g/m² and a density of 0.5 g/m³. The base paper for laminated sheet was subjected to pretreatment by impregnating with a water-soluble phenolic resin and drying such that a resin content was 10%. Thereafter, 100 parts by weight of a bisphenol-A type epoxy resin having an epoxy equivalent of 450 to 500 was blended with 4 parts by weight of dicyandiamide and 0.2 part by weight of benzyl dimethylamine and then with methyl ethyl ketone to prepare an epoxy resin varnish. The dicyandiamide used herein was one having dissolved in a 1:1 mixed solvent of dimethylformamide and methyl cellosolve. The pre-treated base paper for laminated sheet was impregnated with the thus prepared epoxy resin varnish and dried to prepare a prepreg having a resin content of 40%. Eight prepregs thus prepared were piled and molded by heat and pressure at 170° C. for 60 minutes at 90 kg/cm² to obtain a laminated sheet having a thickness of 1.6 mm.

As shown in the table below, the thus obtained laminated sheet exhibited punchability comparable to the phenolic resin-impregnated laminated sheet of Example 4 and was quite excellent in the insulation resistance at normal state and after boiling and the dielectric constant and dielectric dissipation factor after moisture absorption treatment as well as the heat resistance.

COMPARATIVE EXAMPLE 1

A laminated sheet having a thickness of 1.6 mm was obtained in the same manner as in Example 1 except that a bleached hardwood kraft pulp having an α-cellulose content of 86.6% and beaten to an extent of a CSF of 500 ml was used.

The results of measuring various characteristics of the thus obtained laminated sheet are shwon in the table below. The punchability was greatly inferior at 55° C. or lower. Further, the insulation resistance at normal state and after boiling, the dielectric constant and dielectric dissipation factor after moisture absorption treatment, and the heat resistance were also inferior to those in Examples 1 to 5.

COMPARATIVE EXAMPLE 2

A prepreg having a resin content of 50% was prepared from the base paper for laminated sheet of Comparative Example 1. Eight prepregs thus prepared were piled, and an adhesive-applied copper foil having a thickness of 35 microns was placed on one side of the prepregs. The resulting prepregs with copper foil was molded by heat and pressure under the same conditions as in Example 1 to obtain a copper foil-clad laminated sheet having a thickness of 1.6 mm.

The results of measuring various characteristics of the thus obtained laminated sheet are shown in the table below. The various characteristics such as punchability were substantially equal to those in Comparative Example 1, which were inferior to those in Examples 1 to 5.

COMPARATIVE EXAMPLE 3

A laminated sheet having a thickness of 1.6 mm was obtained in the same manner as in Example 6 except that a bleached hardwood kraft pulp having an α-cellulose content of 86.6% and beaten to an extent of a CSF of 500 ml was used.

The results of measuring various characteristics of the thus obtained laminated sheet are shown in the table below. The laminated sheet was not good in the punchability and heat resistance as compared with that in Example 6.

TABLE 1

| Test Item | Example 1 | Example 2 | Example 3 | Example 4 | Example 5 | Example 6 | Comparative Example 1 | Comparative Example 2 | Comparative Example 3 |
|---|---|---|---|---|---|---|---|---|---|
| **Punchability*1** | | | | | | | | | |
| 35° C. | fair | fair | fair | good | fair | good | poor | poor | poor |
| 55° C. | good | good | good | excellent | good | excellent | fair | fair | fair |
| 75° C. | excellent | excellent | excellent | excellent | excellent | excellent | good | good | good |
| 95° C. | excellent | excellent | excellent | excellent | excellent | excellent | good | good | good |
| **Insulation*2 Resistance ($\Omega$)** | | | | | | | | | |
| normal state | $3 \times 10^{11}$ | $3 \times 10^{11}$ | $4 \times 10^{11}$ | $1 \times 10^{12}$ | $6 \times 10^{11}$ | $7 \times 10^{12}$ | $2 \times 10^{11}$ | $2 \times 10^{11}$ | $2 \times 10^{12}$ |
| after boiling | $2 \times 10^{8}$ | $2 \times 10^{8}$ | $2 \times 10^{8}$ | $3 \times 10^{8}$ | $2 \times 10^{8}$ | $6 \times 10^{8}$ | $5 \times 10^{7}$ | $5 \times 10^{7}$ | $9 \times 10^{7}$ |
| **Dielectric*2 Constant (1 MHz)** | | | | | | | | | |
| normal state | 3.7 | 3.8 | 3.7 | 3.8 | 3.8 | 3.2 | 3.6 | 3.7 | 3.2 |
| after moisture absorption treatment | 5.6 | 5.6 | 5.4 | 5.6 | 6.1 | 4.2 | 6.4 | 6.4 | 5.0 |
| **Dielectric*2 Dissipation Factor (1 MHz)** | | | | | | | | | |
| normal state | 0.038 | 0.037 | 0.036 | 0.038 | 0.037 | 0.031 | 0.035 | 0.035 | 0.031 |
| after moisture absorption treatment | 0.084 | 0.085 | 0.070 | 0.065 | 0.106 | 0.051 | 0.131 | 0.131 | 0.062 |
| Heat Resistance*3 | 250 | 250 | 250 | 270 | 250 | 275 | 240 | 240 | 245 |

TABLE 1-continued

| Test Item | Example 1 | Example 2 | Example 3 | Example 4 | Example 5 | Example 6 | Comparative Example 1 | Comparative Example 2 | Comparative Example 3 |
| --- | --- | --- | --- | --- | --- | --- | --- | --- | --- |
| in Air (°C.) | | | | | | | | | |

[a1] Using a test mold having a distance between hole walls of a die of 0.8, 1.0, 1.2, and 1.6 mm, equipped with a pair of round holes having a diameter of 1.0, 1.2, 1.7, and 2.1 mm and a pair of square holes of 1 mm × 2 mm, and having a clearance between the punch and one side of the die of 0.05 mm, the punching was conducted by changing the surface temperature of the laminated sheet, and the state of the surface, hole, and cut area after the punching was evaluated on four scales in accordance with ASTM D617.

[a2] In accordance with JIS C6481 and JIS K6911.

[a3] The laminated sheet which had been pre-treated at 105° C. for 15 hours was heated in an air-circulating oven for 5 minutes, and the maximum temperature at which the generation of blister did not appear was measured.

While the invention has been described in detail and with reference to specific embodiments thereof, it will be apparent to one skilled in the art that various changes and modifications can be made therein without departing from the spirit and scope thereof.

What is claimed is:

1. A process for the production of a laminated sheet comprising:
   (a) impregnating a base paper for laminated sheet made from a wood pulp and having an α-cellulose content of 87.0% or more with a synthetic resin to prepare a prepreg; and
   (b) subjecting the said prepreg to laminate molding by heat.

2. A process for the production of a metal foil-clad laminated sheet comprising:
   (a) impregnating a base paper for laminated sheet using a wood pulp having an α-cellulose content of 87.0% or more with a synthetic resin to prepare a prepreg,
   (b) piling up the prepreg,
   (c) placing a metal foil on either one or both sides of the prepreg, and
   (d) subjecting the resulting prepreg with metal foil laminate molding by heat.

3. The process of claim 1, wherein the wood pulp is obtained by:
   (I) pulping wood chips chemically with acid sulfite, bisulfite, by kraft cooking, or by a multi-stage combination thereof,
   (II) purifying or extracting the product of step (I) with alkali, and
   (III) bleaching the alkali-treated product with a bleaching agent selected from the group consisting of chlorine, chlorine dioxide, hypochlorite and hydrogen peroxide.

4. The process of claim 3, wherein the wood chips are hydrolyzed with super heated steam prior to kraft cooking in step (I), and purified with cold alkali before or after bleaching in step (III).

5. The process of claim 3 further comprising:
   (IV) lightly beating the pulp to obtain a CSF value of 450 ml or higher.

6. The process of claim 1, wherein the base paper has:
   a weight of between about 80 and 200 g/m$^2$, and
   a density of between about 0.4 and 0.6 g/cm$^3$.

7. The process of claim 1, wherein the base paper further contains an agent selected from the group consisting of a wet or dry strength agent, a flame retarding aid, and a flame retardant.

8. The process of claim 1, wherein the resin is a thermosetting resin selected from the group consisting of a phenolic resin, a melamine resin, a diallyl phthalate resin, an epoxy resin, and an unsaturated polyester resin.

9. The process of claim 1, wherein the resin is selected from the group consisting of a fluorocarbon resin, a polyester resin, and a polyamide resin.

10. The process of claim 1, wherein the resin content in the prepreg is between about 40 and 65%.

11. The process of claim 1, wherein the resin further contains an agent selected from the group consisting of a filler, a pigment, a dye and a flame retardant.

12. The process of claim 2, wherein the metal foil is selected from the group consisting of copper foil and aluminum foil.

* * * * *